United States Patent
Lin et al.

(10) Patent No.: US 9,240,503 B2
(45) Date of Patent: Jan. 19, 2016

(54) METHODS OF MANUFACTURING AND USING A PHOTODIODE WITH CONCAVE REFLECTOR

(71) Applicant: Taiwan Semiconductor Manufacturing Company, Ltd., Hsin-Chu (TW)

(72) Inventors: Che-Min Lin, Tainan (TW); Volume Chien, Tainan (TW); Chih-Kang Chao, Tainan (TW); Chi-Cherng Jeng, Tainan (TW); Pin Chia Su, Shanhua Township (TW); Chih-Mu Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/469,496

(22) Filed: Aug. 26, 2014

(65) Prior Publication Data
US 2014/0367820 A1    Dec. 18, 2014

Related U.S. Application Data

(62) Division of application No. 13/742,747, filed on Jan. 16, 2013, now Pat. No. 8,816,415.

(60) Provisional application No. 61/731,097, filed on Nov. 29, 2012.

(51) Int. Cl.
*H01L 31/0232* (2014.01)
*H01L 31/115* (2006.01)
*H01L 31/10* (2006.01)
*H01L 31/18* (2006.01)
*H01L 27/146* (2006.01)

(52) U.S. Cl.
CPC .... *H01L 31/02327* (2013.01); *H01L 27/14629* (2013.01); *H01L 31/0232* (2013.01); *H01L 31/10* (2013.01); *H01L 31/115* (2013.01); *H01L 31/18* (2013.01)

(58) Field of Classification Search
CPC . H01L 31/02327; H01L 31/115; H01L 31/10; H01L 31/18; H01L 27/14629
USPC ............................................. 438/69
See application file for complete search history.

(56) References Cited

U.S. PATENT DOCUMENTS

| | | | | |
|---|---|---|---|---|
| 5,172,206 | A * | 12/1992 | Iizuka | 257/291 |
| 7,755,123 | B2 * | 7/2010 | Dungan et al. | 257/294 |
| 7,982,177 | B2 | 7/2011 | Nozaki et al. | |
| 2010/0072568 | A1 * | 3/2010 | Park | 257/432 |
| 2011/0032405 | A1 | 2/2011 | Nozaki et al. | |
| 2011/0090384 | A1 | 4/2011 | Yamada | |

* cited by examiner

*Primary Examiner* — Savitr Mulpuri
(74) *Attorney, Agent, or Firm* — Slater & Matsil, L.L.P.

(57) ABSTRACT

A photodiode structure includes a photodiode and a concave reflector disposed below the photodiode. The concave reflector is arranged to reflect incident light from above back toward the photodiode.

20 Claims, 3 Drawing Sheets

US 9,240,503 B2

METHODS OF MANUFACTURING AND USING A PHOTODIODE WITH CONCAVE REFLECTOR

This application is a divisional of U.S. patent application Ser. No. 13/742,747, filed on Jan. 16, 2013, and entitled "Photodiode with Concave Reflector," which claims the benefit of U.S. Provisional Application Ser. No. 61/731,097, filed on Nov. 29, 2012, entitled the same, which applications are hereby incorporated herein by reference.

TECHNICAL FIELD

The present disclosure relates generally to an integrated circuit and more particularly a photodiode.

BACKGROUND

Quantum efficiency (QE) is a key factor for a complementary metal-oxide-semiconductor (CMOS) image sensor (CIS), which describes the response efficiency of photo-electron interaction. A photodiode structure with improved quantum efficiency is desirable.

BRIEF DESCRIPTION OF THE DRAWINGS

Reference is now made to the following descriptions taken in conjunction with the accompanying drawings, in which.

DETAILED DESCRIPTION

Figure 1:
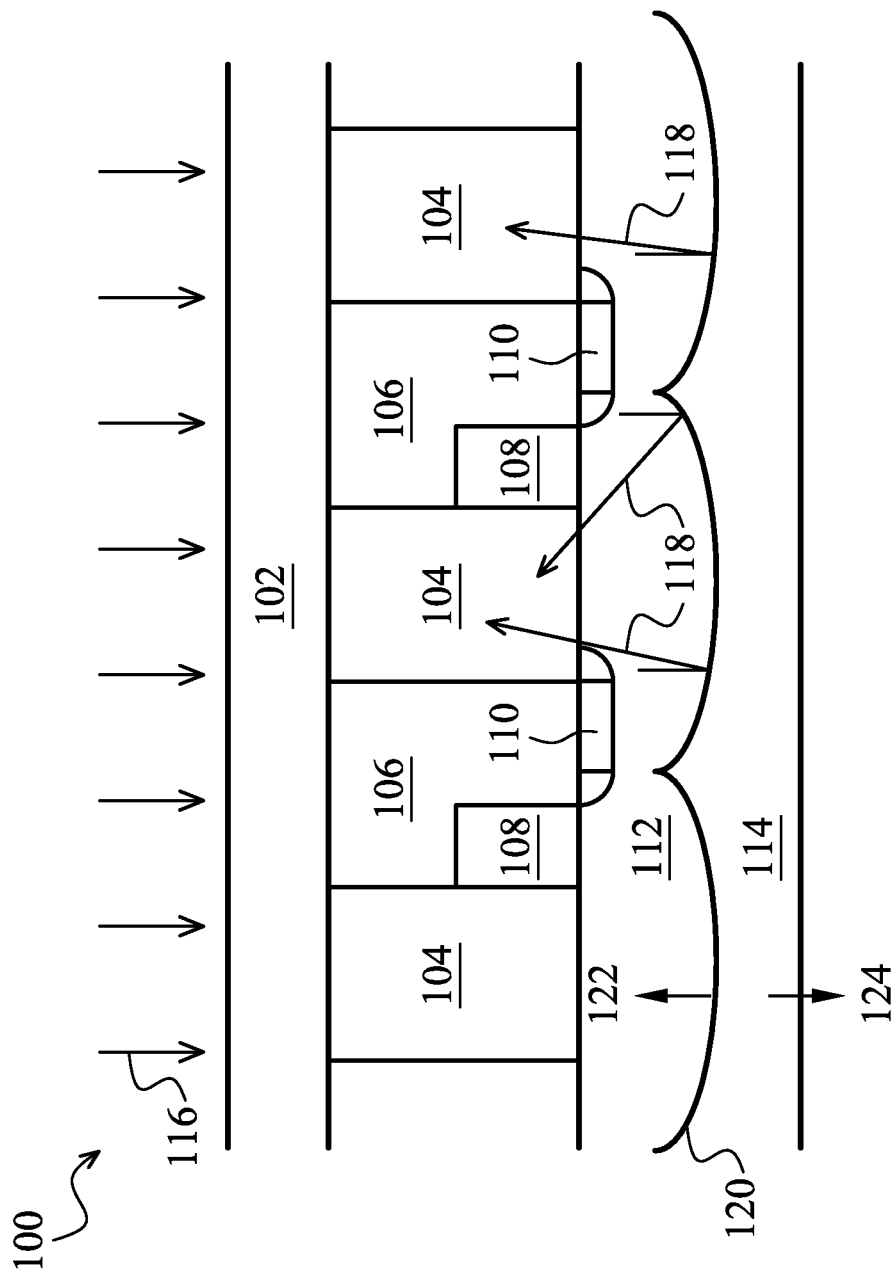
FIG. 1 is a schematic diagram of an exemplary photodiode structure with a concave reflector according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary photodiode structure 100 with a concave reflector 120 according to some embodiments. The photodiode structure 100 includes a photodiode 104 and the concave reflector 120 disposed below the photodiode 104. The concave reflector 120 is arranged to reflect incident light 116 from above back toward the photodiode 104 as the reflected light 118. In some embodiments with a 1.75 μm pixel size array, the photodiode 104 has a width of about 1.5 μm and a distance of about 1.75 μm between photodiodes.

The photodiode structure 100 has a substrate 102 disposed over the photodiode 104. In the fabrication process of some embodiments, the photodiode structure 100 is processed upside down so that the substrate 102 is at the bottom and the photodiode 104, the concave reflector 120, and other structures can be fabricated over the substrate 102. Afterwards, the substrate 102 is thinned by chemical-mechanical polishing (CMP) process for backside illumination.

In some embodiments, the thinned substrate 102 has a thickness ranging from 1 μm to 3 μm. The substrate 102 can comprise silicon, silicon dioxide, aluminum oxide, sapphire, germanium, gallium arsenide (GaAs), an alloy of silicon and germanium, indium phosphide (InP), silicon on insulator (SOI), or any other suitable material.

The concave reflector 120 is formed at the boundary by a first dielectric layer 112 having a concave surface toward the photodiode 104 and a second dielectric layer 114. The first dielectric layer 112, e.g., an inter-layer dielectric (ILD), is disposed below the photodiode 104 and has a first refractive index N1. The second dielectric layer 114, e.g., an ILD, is disposed below the first dielectric layer 112 and has a second refractive index N2 that is smaller than Ni. The first dielectric layer 112 has a concave surface towards the photodiode 104 (as indicated by an arrow 122), which can be also viewed as a convex surface away from the photodiode 104 (as indicated by an arrow 124).

In some embodiments, N1 ranges from 2.0 to 2.5 and N2 ranges from 1.5 to 2.4. In some embodiments, the first dielectric layer 112 comprises SiN, SiC, any combination thereof, or any other suitable material, and the second dielectric layer 114 comprises $SiO_2$ or any other suitable material. In some embodiments, the first dielectric layer 112 has a thickness of about 2000 angstrom with a width (i.e., the dimension perpendicular to the thickness) of about 1.75 μm and the second dielectric layer 114 has a thickness of about 2000 angstrom.

The concave reflector 120 reflects and focuses incident light 116 from above through the thinned substrate 102 (i.e., backside illumination) back towards the photodiode 104. This enhances the photo-electron interaction efficiency, and thus increases the quantum efficiency (QE) of the photodiode 104. The concave reflector 120 forms a continuous reflector surface to collect as much light as possible. The shape of the concave reflector 120 can be a portion of a circle, an oval, a polygon, or any other shape.

An isolation area such as an implanted silicon area 106 and/or a dielectric film 108 are disposed adjacent the photodiode 104. The implanted silicon 106 is doped with P-type dopants such as boron, and can be any other semiconductor or substrate material having dopants in other embodiments. The P-type implant functions as a potential barrier for electrons as signal carriers in the photodiode structure 100. The implanted silicon area 106 for isolation can be formed deeper (more close to backside surface) than the dielectric film 108 for isolation.

Compared to the N-type dopants in the PN junction of the photodiode 104, the doping of the P-type dopants in the implanted silicon 106 has a doping range of about one to ten times in some embodiments. For example, the P-type doping range in the implanted silicon 106 is $1.E15$-$4.E16$ atom/$cm^3$ in some embodiments. The dielectric film 108 comprises silicon dioxide ($SiO_2$) and has a thickness of about 0.25 µm with a width of about 0.17 µm in some embodiments.

A complementary metal-oxide-semiconductor (CMOS) transfer gate circuit 110 is disposed below the substrate 102. The transfer gate circuit 110 converts photocurrent from the photodiode 104 to a voltage or current signal to be provided for the next stage.

Figure 2:
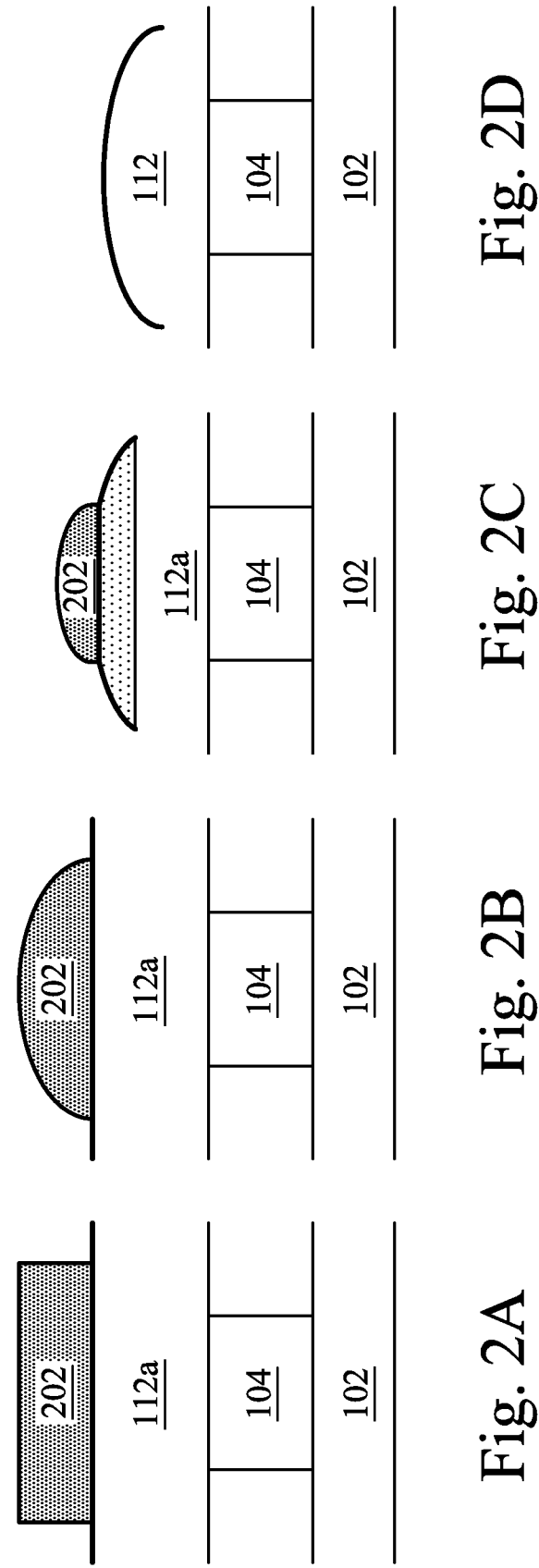
FIGS. 2A-2D are intermediate fabrication steps of the concave shape of the first dielectric layer 112 of the exemplary photodiode structure in FIG. 1 according to some embodiments.

FIGS. 2A-2D are intermediate fabrication steps of the concave shape of the first dielectric layer 112 of the exemplary photodiode structure 100 in FIG. 1 according to some embodiments. In FIG. 2A, a photoresist layer 202 is deposited over a first dielectric layer 112a disposed over the photodiode 104 (and the substrate 102). The first dielectric layer 112a is not yet made into a concave shape such as 112 shown in FIG. 1. The photoresist layer 202 is patterned so that a desired area of photoresist layer 202 remains over the photodiode 104.

In FIG. 2B, the photoresist layer 202 is cured to result in a concave shape towards the photodiode 104, which can be also viewed as a convex shape away from the photodiode 104.

In FIG. 2C, the first dielectric layer 112a in FIG. 2B is dry etched to transfer the photoresist layer 202 shape.

In FIG. 2D, the first dielectric layer 112 has a concave shape towards the photodiode 104 from the dry etching using the concave shape of the photoresist layer 202 in FIG. 2B. The remaining photoresist layer 202 is removed.

Any other suitable process may be used to achieve the concave shape of the photoresist layer 202 and the first dielectric layer 112. For example, the photoresist material can be sprayed to form the photoresist layer 202 so that surface tension of the photoresist material will form the curved shape. Any microlens etching process known in the art can be also used to shape the first dielectric layer 112.

Figure 3:
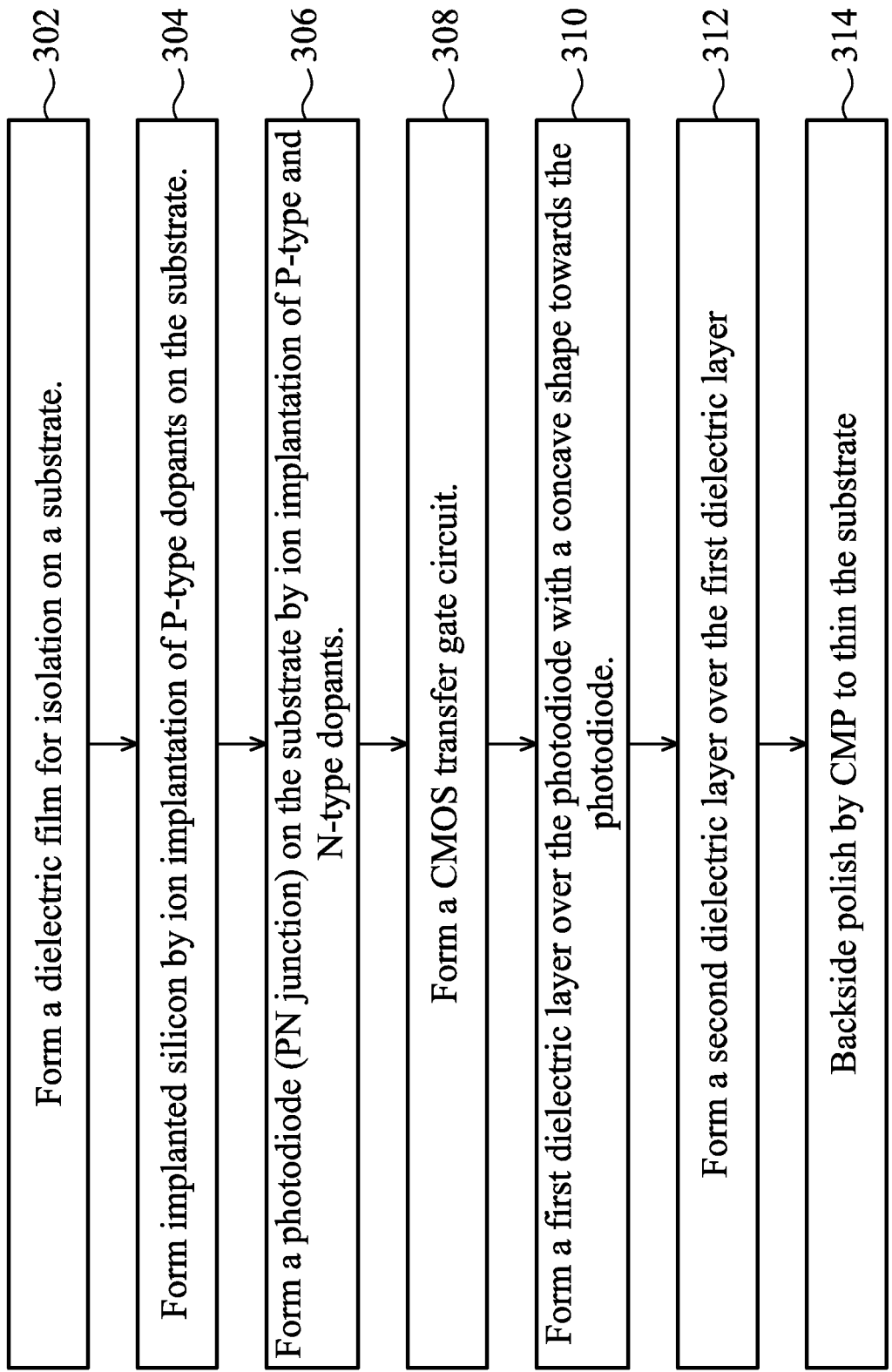
FIG. 3 is a flowchart of a method of fabricating the exemplary photodiode structure in FIG. 1.

FIG. 3 is a flowchart of a method of fabricating the exemplary photodiode structure 100 in FIG. 1. At step 302, a dielectric film such as an oxide ($SiO_2$) film is formed on a substrate for isolation by high density chemical vapor deposition (CVD), for example. The dielectric film comprises silicon dioxide ($SiO_2$) and has a thickness of about 0.25 µm with a width of about 0.17 µm in some embodiments. The substrate can comprise silicon, silicon dioxide, aluminum oxide, sapphire, germanium, gallium arsenide (GaAs), an alloy of silicon and germanium, indium phosphide (InP), silicon on insulator (SOI), or any other suitable material.

At step 304, an implanted silicon area is formed on the substrate by ion implantation of P-type dopants such as boron, for example. The P-type implant functions as a potential barrier for electrons as signal carriers in the photodiode structure. The implanted silicon can be any other semiconductor or substrate material having dopants in other embodiments.

At step 306, a photodiode (PN junction) is formed on the substrate by any known methods in the art. For example, photodiode (PN junction) is formed by ion implantation of P-type such as boron and N-type dopants such as phosphorus. In some embodiments with a 1.75 µm pixel size array, the photodiode 104 has a width of about 1.5 µm and the distance of about 1.75 µm between photodiodes.

At step 308, a complementary metal-oxide-semiconductor (CMOS) transfer gate circuit is formed on the substrate by any known methods in the art. The transfer gate circuit converts photocurrent from the photodiode to a voltage or current signal to be provided for the next stage.

At step 310, a first dielectric layer (e.g., an ILD) is formed over the photodiode with a concave shape towards the photodiode, as described in FIGS. 2A-2C, for example. The first dielectric layer has a first refractive index N1. The first dielectric layer has a concave surface towards the photodiode, which can be also viewed as convex away from the photodiode. The shape of the concave reflector can be a portion of a circle, an oval, a polygon, or any other shape.

In some embodiments, N1 ranges from 2.0 to 2.5. In some embodiments, the first dielectric layer comprises SiN, SiC, any combination thereof, or any other suitable material and has a thickness of about 2000 angstrom with a width of about 1.75 µm.

At step 312, a second dielectric layer (e.g., an ILD) is formed over the first dielectric layer. The second dielectric layer has a second refractive index N2 that is smaller than N1. In some embodiments, N2 ranges from 1.5 to 2.4. The second dielectric layer comprises $SiO_2$ or any other suitable material, and the second dielectric layer has a thickness of about 2000 angstrom.

From the above processes, a concave reflector is formed at the boundary of the first dielectric layer and the second dielectric layer, which reflects and focuses incident light from backside illumination through the thinned substrate back towards the photodiode. This enhances the photo-electron interaction efficiency, and increases quantum efficiency (QE) of the photodiode. The second dielectric layer can be polished for a subsequent metal process in some embodiments.

At step 314, a backside polish is performed to thin the substrate for backside illumination by CMP, for example. In some embodiments, the thinned substrate has a thickness ranging from 1 µm to 3 µm.

According to some embodiments, a photodiode structure includes a photodiode and a concave reflector disposed below the photodiode. The concave reflector is arranged to reflect incident light from above back toward the photodiode.

According to some embodiments, a method of fabricating a photodiode structure includes forming a photodiode over a substrate. A concave reflector is disposed over the photodiode. The concave reflector is arranged to reflect incident light from below back toward the photodiode.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of fabricating a photodiode structure, the method comprising:

forming a photodiode over a substrate;

forming a concave reflector disposed over the photodiode, wherein the concave reflector is arranged to reflect incident light from below back toward the photodiode; wherein:

forming the concave reflector includes forming a first dielectric layer over the photodiode, wherein the first dielectric layer has a concave surface towards the photodiode and the first dielectric layer has a first refractive index; and forming a second dielectric layer over the first dielectric layer, wherein the second dielectric layer is in physical contact with the concave surface of the first dielectric layer, and the second dielectric layer has a second refractive index that is smaller than the first refractive index.

2. The method of claim 1, wherein forming the first dielectric layer comprises:

depositing a photoresist layer over the first dielectric layer; patterning the photoresist layer; curing the photoresist layer; etching the first dielectric layer; and removing the photoresist layer.

3. The method of claim 1, wherein the first refractive index ranges from 2.0 to 2.5.

4. The method of claim 1, wherein the second refractive index ranges from 1.5 to 2.4.

5. The method of claim 1, further comprising forming an isolation area disposed adjacent the photodiode.

6. The method of claim 5, wherein the isolation area is formed by ion implanting P-type dopants.

7. The method of claim 1, wherein forming the first dielectric layer comprises:

spraying onto a surface of the first dielectric layer a photoresist layer such that surface tension of the photoresist layer forms a curved photoresist shape;

etching the first dielectric layer using the curved photoresist shape as a mask; and removing the photoresist layer.

8. A method of fabricating a photodiode structure, the method comprising:

forming a photodiode over a substrate;

forming a first dielectric layer having a first refractive index over the photodiode, wherein the first dielectric layer has a concave surface towards the photodiode; and forming a second dielectric layer over the first dielectric layer, wherein:

the second dielectric layer is in physical contact with the concave surface of the first dielectric layer; and the second dielectric layer has a second refractive index that is lower than the first refractive index.

9. The method of claim 8, wherein forming the first dielectric layer comprises:

depositing the first dielectric layer with a substantially planar surface; and modifying the substantially planar surface of the first dielectric layer to become concave.

10. The method of claim 9, wherein modifying the substantially planar surface comprises etching the substantially planar surface to form the concave surface.

11. The method of claim 8, wherein forming a first dielectric layer having a first refractive index over the photodiode comprises:

depositing over the photodiode the first dielectric layer having a substantially planar surface;

forming over the substantially planar surface a patterned masking layer having a curved surface;

and etching the first dielectric layer using the masking layer as an etch mask.

12. The method of claim 11, wherein forming over the substantially planar surface a patterned masking layer having a curved surface comprises:

depositing a photoresist layer over the first dielectric layer; patterning the photoresist layer; and curing the photoresist layer.

13. The method of claim 11, wherein forming over the substantially planar surface a patterned masking layer having a curved surface comprises:

spraying a photoresist layer onto the first dielectric layer.

14. The method of claim 11, wherein forming a first dielectric layer comprises depositing a material selected from the group consisting of SiN, SiC, and combinations thereof.

15. The method of claim 11, wherein forming a second dielectric layer over the first dielectric layer comprises depositing silicon oxide over the first dielectric layer.

16. The method of claim 11, further comprising polishing the second dielectric layer.

17. The method of claim 1, wherein the step of forming a first dielectric layer comprises depositing a material selected from the group consisting of SiN, SiC, and combinations thereof.

18. The method of claim 1, wherein the step of forming a second dielectric layer over the first dielectric layer comprises depositing silicon oxide over the first dielectric layer.

19. A method of fabricating an image sensor device, the method comprising:

forming a photodiode over a substrate; and forming a surface of contact between a first dielectric layer and a second dielectric layer, wherein:

the first dielectric layer is over the photodiode;

the second dielectric layer is over the first dielectric layer;

the first dielectric layer is in physical contact with the second dielectric layer;

the surface of contact is concave toward the photodiode;

the first dielectric layer has a first refractive index; and the second dielectric layer has a second refractive index less than the first refractive index.

20. The method of claim 19, wherein the surface of contact comprises at least one of a circular, elliptical, or polygonal shape.

* * * * *